United States Patent [19]

Ibok et al.

[11] Patent Number: 5,384,272
[45] Date of Patent: Jan. 24, 1995

[54] METHOD FOR MANUFACTURING A NON-VOLATILE, VIRTUAL GROUND MEMORY ELEMENT

[75] Inventors: Effiong E. Ibok; Bradley T. Moore, both of Austin, Tex.

[73] Assignee: Advanced Micro Devices, Inc., Sunnyvale, Calif.

[21] Appl. No.: 266,744

[22] Filed: Jun. 28, 1994

[51] Int. Cl.⁶ ........................................ H01L 21/266
[52] U.S. Cl. .................................... 437/43; 437/952; 437/985
[58] Field of Search ............... 437/43, 952, 978, 985; 148/DIG. 111, DIG. 116, DIG. 117

[56] References Cited

U.S. PATENT DOCUMENTS

| | | | |
|---|---|---|---|
| 4,852,062 | 7/1989 | Baker et al. | 437/43 |
| 5,120,670 | 6/1992 | Bergmont | 437/985 |
| 5,246,874 | 9/1993 | Bergemont | 437/43 |
| 5,256,584 | 10/1993 | Hartmann | 437/43 |

*Primary Examiner*—Tom Thomas
*Assistant Examiner*—Chandra Chaudhari
*Attorney, Agent, or Firm*—Foley & Lardner

[57] ABSTRACT

The invention provides a method for manufacturing a non-volatile, virtual ground memory element. The method includes the steps of depositing a first polysilicon layer on gate oxide on a silicon substrate, depositing or growing a first oxide layer, depositing a barrier nitride layer and patterning the first polysilicon layer, the first oxide layer and the barrier nitride layer to form a floating gate. The method further includes the steps of doping a region of the silicon substrate adjacent the floating gate to form a bit line region and oxidizing the bit line region in a wet ambient. The method further includes the use of a spacer nitride or spacer oxide/nitride layer to protect the edge of the floating gate during oxidation and to reduce dopant diffusion under the gate. The method further includes the steps of stripping the barrier nitride layer, depositing a second polysilicon layer and patterning the second polysilicon layer to form a control gate.

11 Claims, 3 Drawing Sheets

METHOD FOR MANUFACTURING A NON-VOLATILE, VIRTUAL GROUND MEMORY ELEMENT

BACKGROUND OF THE INVENTION

The present invention generally relates to a method for manufacturing a memory element. More particularly, the present invention relates to a method for making a non-volatile memory storage element.

Non-volatile memory storage elements or memory cells generally include a floating gate and a control gate. Data is stored in the memory cell by storing a predetermined amount of charge on the floating gate to define a first storage state, for example, a binary 1, and by removing substantially all charge from the floating gate to define a second storage state, for example, a binary 0.

The floating gate is substantially electrically insulated from other circuit elements. To read or change the storage state of the memory cell, a voltage is applied to the control gate to electrically couple the floating gate to a conductor such as a bit line. Generally, the floating gate is fabricated by patterning a first layer of polysilicon and the control gate is fabricated by patterning a second layer of polysilicon. Materials other than polysilicon may be used for manufacturing the floating gate and the control gate.

To maximize the number of memory cells that can be packed onto a single integrated circuit, the memory cells are made uniformly and as small as possible. To achieve this goal of small size, the floating gate and the control gate are generally fabricated with the control gate located above the floating gate, separated from the floating gate by one or more dielectric layers. Moreover, the conductor which forms the bit line is fabricated from a doped region in the semiconductor substrate itself, adjacent to the floating and control gates.

To further increase the density of storage elements, modern non-volatile memories use a virtual ground design. In a virtual ground design, the core or array of memory cells includes no metal to diffusion contacts between the semiconductor substrate and the most negative potential of the circuit. Such contacts are commonly made throughout an integrated circuit to provide electrical connection to the cells. In the virtual ground design, these electrical connections are provided through the bit line.

Moreover, to conserve space, the virtual ground memory device does not have field oxide isolation in the core or array of memory cells. Field oxide generally electrically isolates individual transistors or groups of transistors. Eliminating field oxide isolation in the core further increases the packing density of memory cells. Growth of the field oxide is generally one of the first steps in processing silicon substrates according to the LOCOS (localized oxidation of silicon) process.

In virtual ground memory devices, processing begins with deposition of a first polysilicon layer on a substrate. The first polysilicon layer will form the floating gates in the completed device. The first polysilicon layer is patterned to produce shapes approximately the width of the finished floating gates. To prevent pitting of exposed silicon surfaces during etching steps following deposition of the first polysilicon layer, a thick oxide is grown on the bit line region adjacent to the floating gate. During bit line oxidation, the exposed sides of the first polysilicon layer shapes are oxidized and oxide encroaches on the top and sides of the polysilicon. During bit line oxidation and subsequent thermal cycles, the dopant introduced into the bit line region diffuses under the floating gate. This diffusion reduces the effective gate length, $L_{eff}$, of the floating gate and allows bit line to bit line leakage, disrupting the reading and storing processes in the memory device.

An important figure of merit in the design and operation of a non-volatile memory device is the coupling ratio. The coupling ratio is defined as the ratio of the capacitance between the first polysilicon layer (floating gate) and the bit line diffusion, Cdp, to the capacitance between the second polysilicon layer (control gate) and the first polysilicon layer (floating gate), Cpp. To minimize programming errors when altering the storage state of a memory element, the coupling ratio should be minimized. That is, Cdp should be decreased and Cpp should be increased.

However, the encroachment of oxide on the top of the first polysilicon layer during bit line oxidation tends to decrease Cpp, the capacitance between the polysilicon layers. Moreover, the diffusion of bit line dopant under the first polysilicon layer control gate during bit line oxidation increases Cdp, the polysilicon-to-diffusion capacitance.

Accordingly, there is a need in the art for a method for manufacturing a floating gate memory device which minimizes the coupling ratio. There is also a need in the art for a method which minimizes bit line to bit line leakage. The method of the present invention solves these problems and provides other advantages over the prior art.

SUMMARY OF THE INVENTION

The present invention provides a method for manufacturing a memory element, the memory element including a floating gate for storing charge, a bit line region for reading and writing the storage state of the memory element, and a control gate for electrically coupling the floating gate and the bit line region. The method includes the steps of depositing a first polysilicon layer on a silicon substrate, depositing a first oxide layer on the first polysilicon layer and depositing a barrier nitride layer on the first oxide layer. The method further includes the steps of patterning the first polysilicon layer, the first oxide layer and the barrier nitride layer, the patterned first polysilicon layer forming the floating gate. The method further includes the steps of doping a region of the silicon substrate adjacent the floating gate to form the bit line region and oxidizing the bit line region in a wet ambient, the wet ambient including both oxygen and water. The method further includes stripping the barrier nitride layer, depositing a second polysilicon layer and patterning the second polysilicon layer to form the control gate.

The invention further provides a method for manufacturing a memory element including the steps of depositing a first polysilicon layer on a silicon substrate on which has been grown a gate oxide, depositing a first oxide layer on the first polysilicon layer, depositing a barrier nitride layer on the first oxide layer, and patterning the first polysilicon layer, the first oxide layer and the barrier layer so that the patterned first polysilicon layer forms the floating gate. The method further includes the steps of doping a region of the silicon substrate adjacent the floating gate to form the bit line region, depositing a second oxide layer, depositing a spacer nitride layer on the second oxide layer, and patterning the spacer nitride layer to form nitride spacers on a side of the floating gate adjacent the bit line region. The method further includes the steps of oxidizing the bit line region in a wet ambient, the wet ambient including both oxygen and water. The method further includes the steps of stripping the barrier nitride layer, depositing a second polysilicon layer, and patterning the second polysilicon layer to form the control gate.

The present invention reduces bit line diffusion under the floating gate, and Cdp (the capacitance between the bit line diffusion and the first polysilicon layer), by using a wet bit line oxidation process. The oxidation on the top of the first polysilicon layer is reduced (and Cpp, the capacitance between the second polysilicon layer and the first polysilicon layer, is increased) by lowering the doping of the first polysilicon layer, increasing the thickness of the barrier nitride layer, and providing a nitride spacer to provide total isolation of the first polysilicon layer floating gate during bit line oxidation. The method may further include forming a layer of oxide on the silicon substrate before depositing the nitride spacer layer.

It is an advantage of the present invention to provide a method of manufacturing a non-volatile memory element which minimizes the coupling ratio of the memory element.

It is a further advantage of the present invention to provide reduced bit line to bit line leakage in a memory device to improve reading and programming of the memory device.

It is a further advantage of the present invention to provide substantially reduced processing time for manufacturing a memory element.

Further advantages and features of the present invention will be apparent from the following specification and claims when considered in connection with the accompanying drawings illustrating the preferred embodiment of the invention.

BRIEF DESCRIPTION OF THE DRAWINGS

For purposes of clarity and ease in understanding the present invention, like elements will be identified by like reference numerals in the various drawings.

DETAILED DESCRIPTION OF THE PREFERRED EMBODIMENT

FIG. 1 is a series of cross-sectional views of a first series of steps for manufacturing a memory element 10 according to the method of the present invention. The memory element 10 is preferably fabricated on a substrate such as a wafer 12 of semiconductor material, preferably silicon. In the cross-sectional views of FIG. 1, as well as in FIGS. 2 and 3, only a small, localized, portion of the substrate 12 is shown. In addition, vertical and horizontal dimensions are not drawn to scale. In the figures, vertical features are emphasized to better illustrate the processing steps in accordance with the method of the present invention.

Figure 1A:
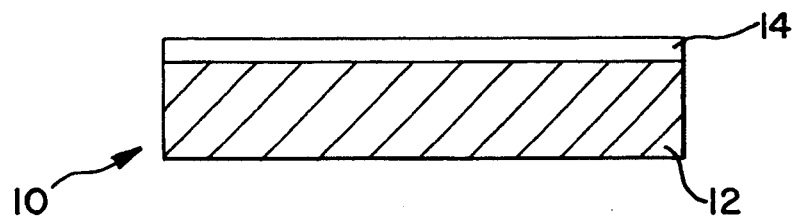
FIGS. 1a–1c are a series of cross-sectional views of a first series of steps for manufacturing a memory element according to the method of the present invention.

The method of the present invention begins at FIG. 1(a). The substrate 12 is initially processed according to standard processing steps routinely used, for example, for manufacturing CMOS (complementary metal oxide semiconductor) integrated circuits. For example, the substrate 12 may be dipped in an etchant to remove any oxide (silicon dioxide) from the surfaces of the substrate 12.

A gate oxide layer 14 is then formed on the surface of the wafer 12. The gate oxide layer is preferably approximately 200 Å thick. The gate oxide layer 14 is preferably a very high electrical quality oxide and is preferably fabricated during a dry oxidation step, with a 3% HCl ambient.

Figure 1B:
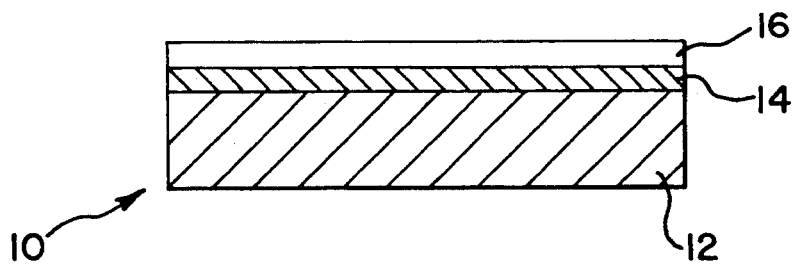

As illustrated in FIG. 1(b), after the gate oxide is grown, a first polysilicon layer 16 is deposited on top of the gate oxide layer 14. Because undoped polysilicon has relatively low conductivity, the first polysilicon layer 16 is doped to make it conductive. For example, the first polysilicon layer 16 may be doped in a diffusion step to have a sheet resistance of, for example, 80 ohms per square.

Figure 1C:
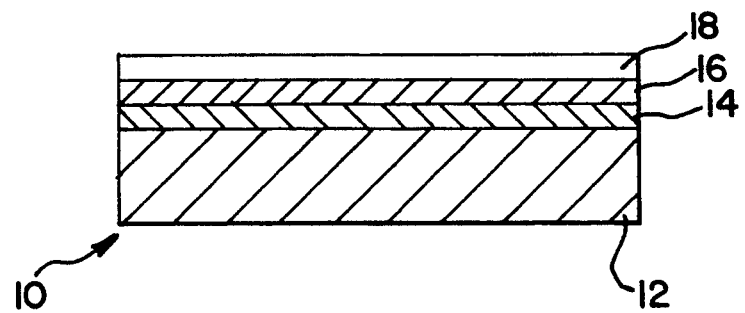

In FIG. 1(c), a layer 18 of oxide has been grown or deposited on the first polysilicon layer 16. This layer 18 may be grown, for example, to reduce the mismatch of thermal expansion coefficients between the polysilicon layer 16 and a silicon nitride layer to be deposited next. The oxide layer 18 may be, for example, 100–200 Å thick.

FIG. 2 is a series of cross-sectional views of a second series of steps for manufacturing a memory element 10 according to the preferred embodiment of the present invention. In FIG. 2(a), a layer 20 of nitride (silicon nitride) has been deposited on the substrate 12 in the region of the memory element 10 fabricated in the first series of steps illustrated in FIG. 1. In the preferred embodiment of the present invention, the barrier nitride layer 20 is preferably approximately 200 Å thick. However, any thickness sufficient to provide adequate protection of the first polysilicon layer 16 and the layer 18 of oxide during subsequent etching and oxidation steps is appropriate.

Figure 2A:
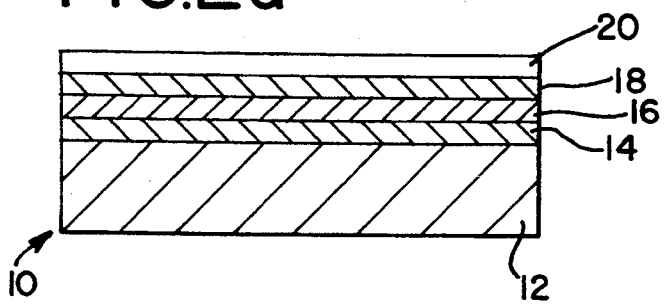
FIGS. 2a–2g are a series of cross-sectional views of a second series of steps for manufacturing a memory element according to the preferred embodiment of the present invention.
Figure 2B:
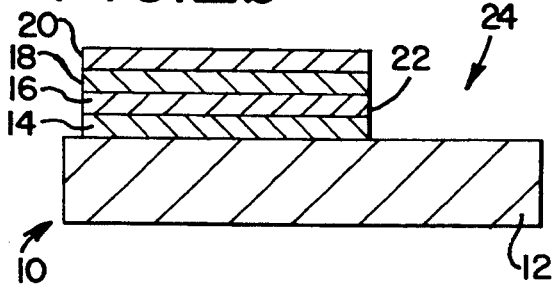

In FIG. 2(b), the memory element 10 has been processed through several photolithography steps to define the regions that will ultimately form a floating gate 22 and a bit line region 24. Photolithography processing of integrated circuits is well known. For example, a layer of photoresist may be applied to the substrate 12 and patterned according to predefined shapes located on a mask. After the photoresist step, portions of the gate oxide layer 14, the first polysilicon layer 16 and the oxide layer 18 are etched away to expose the bit line region 24 and define the floating gate 22.

Figure 2C:
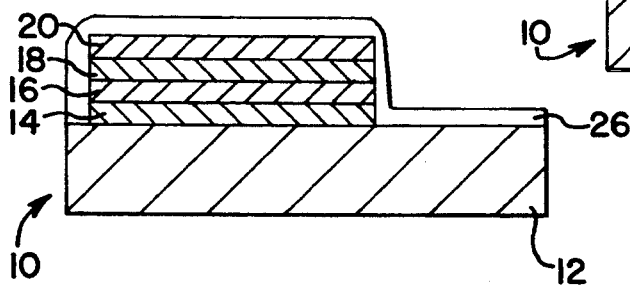
Figure 2D:
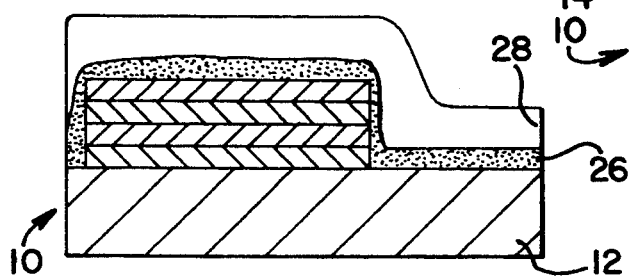

In FIG. 2(c), a layer 26 of oxide has been deposited on the surface of the substrate 12. The oxide layer 26 is preferably deposited using a chemical vapor deposition (CVD) process. The oxide layer 26 is preferably approximately 300 Å thick. In FIG. 2(d), a spacer layer 28 of nitride is deposited on the substrate 12 on the CVD oxide layer 26. This spacer nitride layer 28 is preferably approximately 800 Å thick.

Figure 2E:
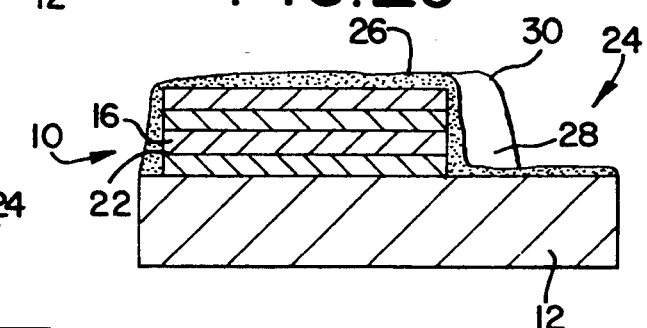

In FIG. 2(e), a portion of the spacer nitride layer 28 has been anisotropically etched using known processes. Only a nitride spacer 30 remains. As a result, the first polysilicon layer 16, forming the floating gate 22, is now completely isolated by the CVD oxide layer 26 and the nitride spacer 30 from further chemical processing which may occur in the bit line region 24.

Figure 2F:
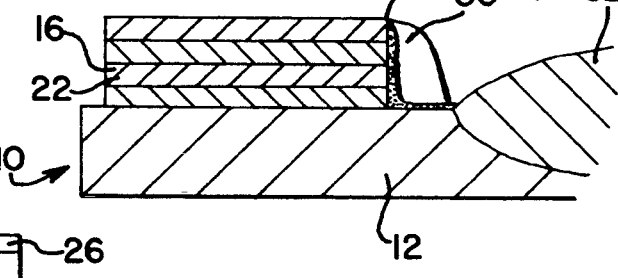

In FIG. 2(f), the bit line region 24 has been oxidized, forming a bit line oxide layer 32. The bit line oxide layer 32 protects the bit line region 24 during subsequent etch steps. Prior to bit line oxidation, the bit line region may be doped, for example, by ion implantation and annealing. Doping makes the bit line region electrically conductive.

Prior art bit line oxidation procedures employ a dry oxidation process. Dry oxidation occurs in an ambient environment containing primarily oxygen, with substantially no steam or water vapor present. Dry oxidation has been heretofore preferred because it was believed that dry oxidation provides an oxide layer having improved electrical quality. That is, it has been thought that only an oxide layer formed with dry oxidation would produce an interface between the oxide layer and adjacent conducting layers with an acceptably low level of charge trapping and with good current conduction. To insure that the electrical junction between the bit line and the floating gate in a non-volatile memory device functions properly, prior art methods have used a dry oxidation process during bit line oxidation.

However, forming a sufficiently thick bit line oxide layer, such as layer 32, which may be 1,000–2,000 Å thick, requires a bit line oxidation step lasting approximately 3.5 hours using a dry oxidation process. During this long bit line oxidation step, dopant ions introduced into the bit line region diffuse under the floating gate. While some diffusion of ions is necessary to permit proper electrical coupling between the bit line and the floating gate, the extensive diffusion resulting from such a 3.5 hour dry bit line oxidation step greatly increases the capacitance between the bit line and the floating gate, or Cdp. Since it is preferable to minimize Cdp, diffusion from the bit line region under the gate should be reduced.

In accordance with the present invention, the bit line oxidation layer 32 is preferably formed using a wet bit line oxidation process. An oxidation step, lasting approximately 6.5 minutes, in a wet ambient containing both oxygen and steam or water vapor, is preferably used in place of the 3.5 hour oxidation step using oxygen alone (i.e., a dry oxidation process). The resulting bit line oxide layer 32 is of sufficiently high electrical quality for forming a junction between the bit line region 24 and the floating gate 22. The wet bit line oxidation process produces acceptably low charge trapping and good current conduction. Moreover, the shorter wet bit line oxidation process greatly reduces diffusion of dopant under the floating gate 22, thereby reducing Cdp. Reducing Cap improves the coupling ratio between Cdp and Cpp—the capacitance between the control gate and the floating gate—and improves the reliability of programming of the non-volatile memory element 10.

Figure 2G:
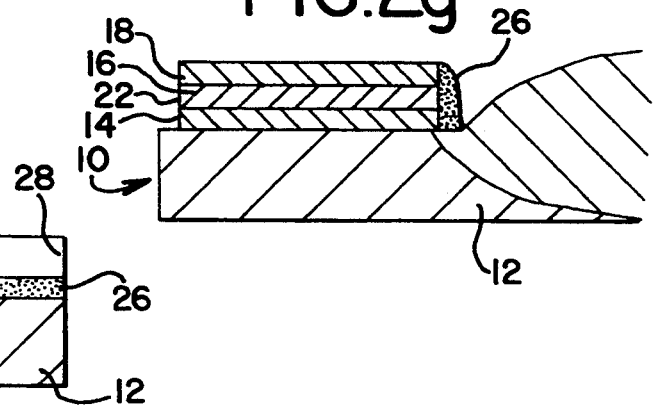

FIG. 2(g) illustrates the memory element 10 following a nitride strip step to remove the nitride spacer 30 and the barrier nitride layer 20. Because the first polysilicon layer 16, which forms the floating gate 22, was isolated by the CVD oxide layer 26 and the nitride spacer 30 during the bit line oxidation step, the oxide layer on top of the first polysilicon layer 16 has not increased in thickness. Prior art processing methods which did not use the CVD oxide layer 26 and the nitride spacer experienced oxide encroachment on top of the first polysilicon layer 16 during the bit line oxidation step. Such oxidation encroachment decreased the capacitance between the floating gate and the control gate, Cpp, thereby undesirably increasing the coupling ratio.

Use of the CVD oxide layer 26 provides positive process control when removing the nitride spacer 30. The etchant which removes the nitride forming the nitride spacer 30 will not affect the CVD oxide layer 26. The CVD oxide layer 26 thus protects the first polysilicon layer 16 from oxide encroachment of the etchant which removes the nitride. At the point in the process illustrated in FIG. 2(g), the substrate 12 is ready for continued processing, including such steps as formation of a second polysilicon layer which will be patterned to form the control gate.

FIG. 3 is a series of cross-sectional views of a memory element 10 fabricated in a second series of steps according to an alternative embodiment of the present invention. In FIG. 3, a thick barrier nitride layer 20 has been formed on substrate 12. Previously, a gate oxide layer 14, a first polysilicon layer 16 and an oxide layer 18 had been formed on the substrate 12, as illustrated in FIG. 1. The thick barrier nitride layer 20 is preferably approximately 800 Å thick.

In the embodiment of the invention illustrated in FIG. 3, the CVD oxide layer 26, used in the embodiment of the invention illustrated in FIG. 2, is omitted. When such a CVD oxide layer is used during the bit line oxidation step oxygen may diffuse through the CVD oxide layer and attack the first polysilicon layer 16. Omitting the CVD oxide layer eliminates this problem.

Figure 3A:
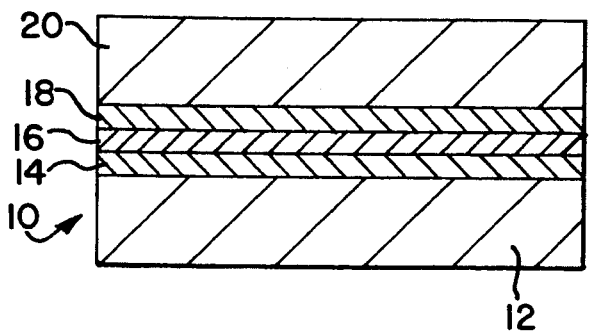
FIGS. 3a–3f are a series of cross-sectional views of a second series of steps for manufacturing a memory element according to an alternative embodiment of the present invention.
Figure 3B:
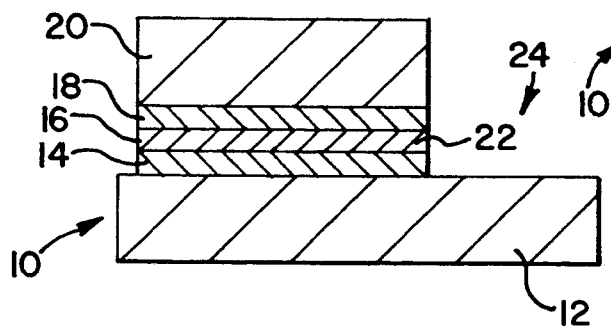
Figure 3C:
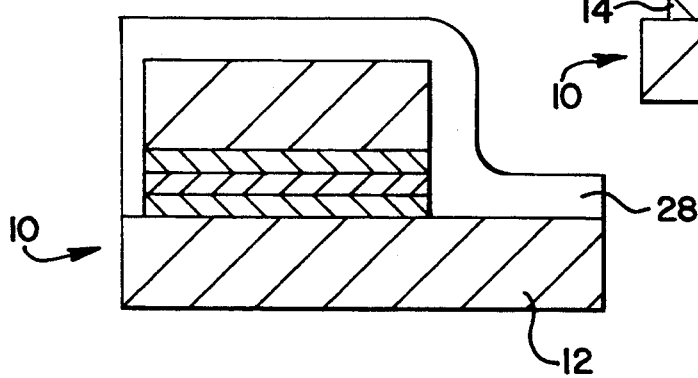
Figure 3D:
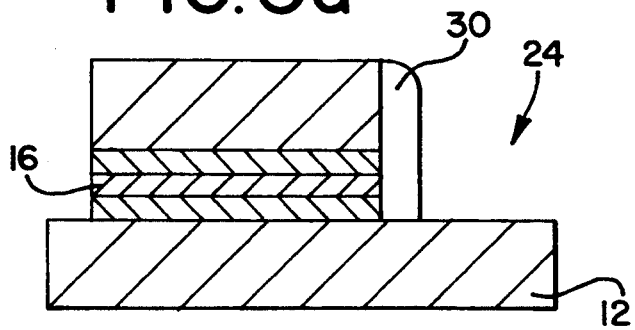

In FIG. 3(b), the memory element 10 has been patterned using photolithographic techniques to define a bit line region 24 and a floating gate 22, formed from the first polysilicon layer 16. In FIG. 3(c), a spacer nitride layer 28 has been deposited on the substrate 12. The spacer nitride layer 28 is preferably approximately 800 Å thick. In FIG. 3(d), the spacer nitride layer 28 has been etched away to leave a nitride spacer 30. The first polysilicon layer 16 is protected by the nitride spacer 30 from chemical processing steps occurring at the bit line region 24.

Figure 3E:
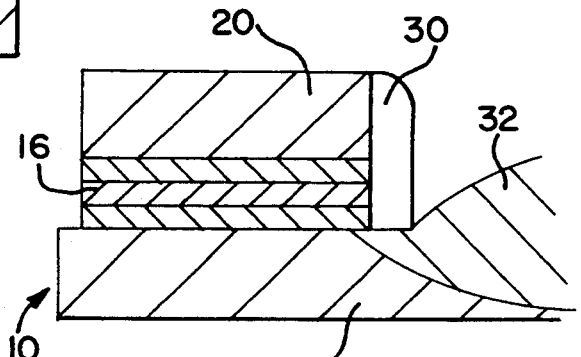

In FIG. 3(e), a bit line oxide layer 32 has been formed on the surface of the substrate 12. Preferably, the bit line oxide layer 32 is formed using a wet bit line oxidation process, as discussed above in conjunction with FIG. 2.

Figure 3F:
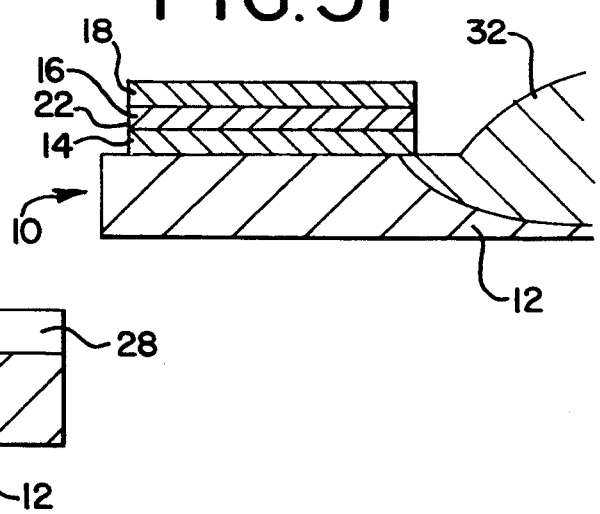

In FIG. 3(f), the barrier nitride layer 20 and the nitride spacer 30 have been etched away and the substrate 12 is now ready for further processing steps, such as formation of a second polysilicon layer which may be patterned to define the control gate. Because the CVD oxide layer 26 of the second embodiment of the present invention illustrated in FIG. 2 is not present in the embodiment of the invention illustrated in FIG. 3, the time for etching the barrier nitride layer 20 and the nitride spacer 30 must be carefully controlled. Since the CVD oxide layer is not present to provide positive process control, the nitride etch step must be timed to prevent damage to the first polysilicon layer 16 which forms the floating gate 22. However, by including the thick (approximately 800 Å) barrier nitride layer, flexibility in the timing of the nitride etch step is provided.

It is to be understood that, while the detailed drawings and specific examples given describe preferred embodiments of the invention, they are for the purpose of illustration only, that the apparatus of the invention is not limited to the precise details and conditions disclosed, and various changes may be made therein. For example, the doping of the bit line region, by implantation or otherwise, could occur after the definition of the nitride spacer. The dopant displacement from the edge of the first polysilicon layer would, after subsequent thermal cycles, correspondingly decrease the drain encroachment under the floating gate. This would decrease the floating gate-drain capacitance and correspondingly decrease the coupling ratio. Similarly, other such changes may be made without departing from the spirit of the invention which is defined by the following claims.

We claim:

1. A method for manufacturing a memory element, said memory element for storing an electrical charge, said storage of said electrical charge defining the storage state of said memory element, said memory element including a floating gate for storing said charge, a bit line region for reading and writing said storage state, and a control gate for electrically coupling said floating gate and said bit line region, the method comprising the steps of:

depositing a first polysilicon layer on a silicon substrate;
   forming a first oxide layer on said first polysilicon layer;
   depositing a barrier nitride layer on said first oxide layer;
   patterning said first polysilicon layer, said first oxide layer and said barrier nitride layer, said patterned first polysilicon layer forming said floating gate;
   doping a region of said silicon substrate adjacent said floating gate to form said bit line region;
   oxidizing said bit line region in a wet ambient, said wet ambient including both oxygen and water;
   stripping said barrier nitride layer;
   depositing a second polysilicon layer; and
   patterning said second polysilicon layer to form said control gate.

2. A method for manufacturing a memory element as recited in claim 1 wherein the method comprises the further steps of depositing a second oxide layer after said doping step, depositing a spacer nitride layer on said second oxide layer, and etching said spacer nitride layer to form nitride spacers on sides of said floating gate adjacent to said bit line region before said oxidizing step.

3. A method for manufacturing a memory element as recited in claim 1 wherein said barrier nitride layer has a thickness greater than 200 angstroms.

4. A method for manufacturing a memory element as recited in claim 1 wherein said first oxide layer forming step comprises growing said first oxide layer.

5. A method for manufacturing a memory element as recited in claim 1 wherein said first oxide layer forming step comprises depositing said first oxide layer.

6. A method for manufacturing a memory element as recited in claim 1 wherein the method further comprises the step of forming a gate oxide on said silicon substrate before forming said first polysilicon layer.

7. A method for manufacturing a memory element, said memory element for storing an electrical charge, said storage of said electrical charge defining the storage state of said memory element, said memory element including a floating gate for storing said charge, a bit line region for reading and writing said storage state, and a control gate for electrically coupling said floating gate and said bit line region, the method comprising the steps of:

depositing a first polysilicon layer on a silicon substrate;
   forming a first oxide layer on said first polysilicon layer;
   depositing a barrier nitride layer on said first oxide layer;
   patterning said first polysilicon layer, said first oxide layer and said barrier nitride layer, said patterned first polysilicon layer forming said floating gate;
   doping a region of said silicon substrate adjacent said floating gate to form said bit line region;
   depositing a second oxide layer;
   depositing a spacer nitride layer on said second oxide layer;
   etching said spacer nitride layer to form nitride spacers on sides of said floating gate adjacent to said bit line region;
   oxidizing said bit line region in a wet ambient, said wet ambient including both oxygen and water;
   stripping said barrier nitride layer;
   depositing a second polysilicon layer; and
   patterning said second polysilicon layer to form said control gate.

8. A method for manufacturing a memory element as recited in claim 7 wherein the method further comprises the step of forming a gate oxide on said silicon substrate before forming said first oxide layer.

9. A method for manufacturing a memory element as recited in claim 7 wherein said first oxide layer forming step comprises growing said first oxide layer.

10. A method for manufacturing a memory element as recited in claim 7 wherein said first oxide layer forming step comprises depositing said first oxide layer.

11. A method for manufacturing a memory element as recited in claim 7 wherein said doping step occurs after said etching step.

* * * * *